United States Patent
Lee et al.

(10) Patent No.: US 10,672,604 B2
(45) Date of Patent: Jun. 2, 2020

(54) METAL OXIDE-RESISTIVE MEMORY USING TWO-DIMENSIONAL EDGE ELECTRODES

(71) Applicant: The Board of Trustees of the Leland Stanford Junior University, Palo Alto, CA (US)

(72) Inventors: Seunghyun Lee, Yongin (KR); Joon Sohn, Daegoo (KR); Hon-Sum Philip Wong, Stanford, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 0 days.

(21) Appl. No.: 15/710,117

(22) Filed: Sep. 20, 2017

(65) Prior Publication Data

US 2018/0082840 A1    Mar. 22, 2018

Related U.S. Application Data

(60) Provisional application No. 62/397,238, filed on Sep. 20, 2016.

(51) Int. Cl.
| | |
|---|---|
| *H01L 21/02* | (2006.01) |
| *H01L 21/82* | (2006.01) |
| *H01L 27/11* | (2006.01) |
| *H01L 45/00* | (2006.01) |
| *G11C 13/00* | (2006.01) |
| *B82Y 40/00* | (2011.01) |

(52) U.S. Cl.
CPC .... *H01L 21/02233* (2013.01); *G11C 13/0007* (2013.01); *G11C 13/0069* (2013.01); *H01L 21/82* (2013.01); *H01L 27/1112* (2013.01); *H01L 45/08* (2013.01); *H01L 45/1226* (2013.01); *H01L 45/1253* (2013.01); *H01L 45/146* (2013.01); *B82Y 40/00* (2013.01); *G11C 2013/0083* (2013.01); *G11C 2213/52* (2013.01)

(58) Field of Classification Search
CPC ................... H01L 21/02233; H01L 27/1112
See application file for complete search history.

(56) References Cited

U.S. PATENT DOCUMENTS

| | | | |
|---|---|---|---|
| 8,354,660 B2 | 1/2013 | Sekar et al. | |
| 2012/0205606 A1 | 8/2012 | Lee et al. | |
| 2013/0075839 A1* | 3/2013 | Chen | H01L 43/08 257/421 |
| 2014/0268993 A1* | 9/2014 | Chiang | G11C 13/0002 365/148 |
| 2015/0028279 A1* | 1/2015 | Hopstaken | H01L 45/16 257/4 |
| 2017/0365781 A1* | 12/2017 | Jang | G11C 13/0007 |

(Continued)

OTHER PUBLICATIONS

Sohn et al., 'Atomically Thin Graphene Plane Electrode for 3D RRAM', Dec. 2014, IEDM.

(Continued)

*Primary Examiner* — Mounir S Amer
(74) *Attorney, Agent, or Firm* — Lumen Patent Firm

(57) ABSTRACT

Improved resistive random access memory (RRAM) devices are provided that use a 2-D electrode as the SET electrode to take up a variable amount of oxygen from an oxide material, thereby providing a non-volatile resistive memory cell.

8 Claims, 18 Drawing Sheets

(56) References Cited

U.S. PATENT DOCUMENTS

2018/0219154 A1* 8/2018 Majhi .................... H01L 45/08

OTHER PUBLICATIONS

Lee et al., 'Graphene Plane Electrode for Low Power 3D Resistive Random Access Memory', May 2016, 229th ECS meeting.
Lee et al.,, 'Metal oxide-resistive memory using graphene-edge electrodes', Sep. 25, 2015, Nature Communications, DOI: 10.1038/ncomms9407.

* cited by examiner

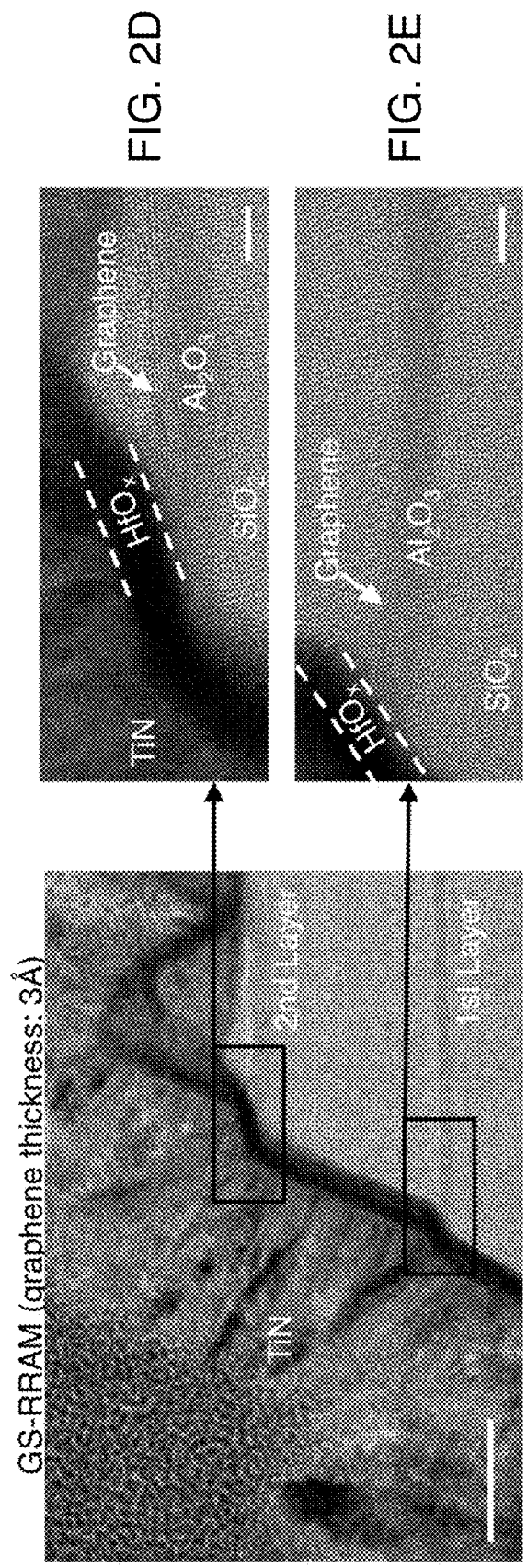

METAL OXIDE-RESISTIVE MEMORY USING TWO-DIMENSIONAL EDGE ELECTRODES

CROSS REFERENCE TO RELATED APPLICATIONS

This application claims the benefit of U.S. provisional patent application 62/397,238, filed on Sep. 20, 2016, and hereby incorporated by reference in its entirety.

GOVERNMENT SPONSORSHIP

This invention was made with Government support under contract N66001-12-C-2013 awarded by the SPAWAR Systems Center. The Government has certain rights in the invention.

FIELD OF THE INVENTION

This invention relates to resistive random access memory devices.

BACKGROUND

Many physical effects have been considered for use in non-volatile memories. One such effect is creation of conductive filaments in an otherwise insulating oxide material. These conductive filaments are formed by oxygen vacancies, and result in a variable resistance between two electrodes sandwiching the oxide material. In order to create a variable resistance for these conducting filaments, one of the electrodes needs to be able to take up oxygen from the oxide (to provide the low resistance state) and release it back to the oxide (to provide the high resistance state). These changes in resistance are the relevant state changes for information storage. It is convenient to refer to the electrode that takes up and releases oxygen in this way as the SET electrode. Prior to normal operation of such devices, a 'forming' step is typically performed by applying a relatively high voltage (i.e., higher than normal operating voltages for changing state) to the device. This initial forming step determines which of the two electrodes is to be the SET electrode according to the forming voltage polarity. More specifically, the SET electrode will be biased positive relative to the RESET electrode in the forming step. Such devices are often referred to as RRAM (resistive RAM) devices.

One recently considered device structure for RRAMs is shown on FIG. 1A. Here 102 is a TiN electrode, 104 is an oxide (hafnium oxide), and 110 is a 2-D graphene electrode sandwiched between insulators 106 and 108. In this work, the device is formed such that TiN electrode 102 is the SET electrode, leading to device operation as shown on FIG. 1B (low resistance state) and FIG. 1C (high resistance state), where the resistance is affected by the presence (or absence) of oxygen (gray circles) in filament 112. Further details relating to this work can be found in (Sohn et al., 'Atomically thin graphene plane electrode for 3-D RRAM' IEDM 2014, 5.3.1 to 5.3.4), hereby incorporated by reference in its entirety.

SUMMARY

We have found, unexpectedly, that the 2-D electrode 110 can be used as the SET electrode, leading to device operation as shown on FIG. 1D (low resistance state) and FIG. 1E (high resistance state), where the resistance is affected by the presence (or absence) of oxygen (gray circles) in filament 114. Even though electrode 110 is a 2-D structure that would not appear to have nearly the oxygen storage capacity of a 3-D electrode such as electrode 102, it turns out to be possible to take up enough oxygen in electrode 110 to form filaments 114 and to subsequently operate the resulting device as an RRAM device.

In an experimental demonstration described below, we use atomically thin graphene edge to assemble a very thin resistive memory stacked in a vertical three-dimensional structure to increase memory integration density. The atomically thin nature of the graphene edge is exploited to assemble a resistive memory (0.3 nm thick) stacked in a vertical three-dimensional structure.

Significant advantages are provided. Use of a 2-D edge SET electrode instead of a 3-D electrode decreases the thickness of the memory device in a 3-D vertical structure. It allows thinner 3-D vertical memory to increase the number of stacks for a high-density 3-D memory. Furthermore, we report some of the lowest power and energy consumption among the emerging non-volatile memories due to an extremely thin electrode with unique properties, low programming voltages, and low current. Circuit analysis of the three-dimensional architecture using experimentally measured device properties show higher storage potential for these devices than for devices based on conventional electrode geometries.

Several variations are possible. Materials other than graphene can be used for the 2-D edge electrodes (e.g. any metallic or semi-metallic 2-D materials including transition metal dichalcogenides). In general, suitable materials for these electrodes will be sufficiently electrically conductive (with sheet resistance lower than 100 k$\Omega$/square) in thin layers (10 nm or less) and not react chemically with oxygen (so that they can take up and release oxygen via physical processes). Conventional metal electrodes, such as platinum, tend to be unsuitable because they do not provide sufficient electrical conductivity in thin layers.

Practice of the invention does not depend critically on the composition of the oxide material or on the composition of the other electrode or on the insulators used to sandwich the 2-D SET electrode. In this experimental work, the oxide material is $HfO_x$ and the other electrode is TiN. However, any material capable of forming variably conductive filaments due to oxygen vacancies under electrical bias can be used as the oxide material. The other electrode can be of any material that is compatible with the oxide material in terms of fabrication and electrical contact performance.

An exemplary embodiment of the invention is a method of making a non-volatile memory device, where the method includes the following steps:

i) providing a structure including an oxide material (e.g., 104 on FIG. 1D) disposed between a first electrode and a second electrode (e.g., 102 on FIG. 1D). Here the first electrode includes a 2-D electrode layer (e.g., 110 on FIG. 1D) sandwiched between a first insulator (e.g., 106 on FIG. 1D) and a second insulator (e.g., 108 on FIG. 1D), and the first electrode contacts the oxide material such that an edge of the 2-D electrode layer contacts the oxide material, as shown on FIGS. 1D-E. Here insulators 106 and 108 can be the same material or different materials.

ii) forming the non-volatile memory device by applying a positive electrical bias to the first electrode relative to the second electrode sufficient to ensure that subsequent device operation changes a state of the non-volatile memory device by transfer of oxygen between the oxide material and the 2-D electrode layer of the first electrode. In fresh devices (e.g., as on FIG. 1A), usually there is no filament 114, thus a high forming voltage is necessary to initiate the switching. In other words, the forming process is the process to generate the filament in a fresh device. Before the forming process, the device is at a high resistance state because there is no filament. After forming process, the device become relatively low resistance state because of filament generation. Forming process is not time dependent. Forming process is usually voltage dependent. Overcoming an energy threshold is often needed to generate the filament. During forming, the voltage and current applied is monitored, and completion of forming is signaled by an abrupt increase in current (due to the low resistance of the newly formed filament). The voltage at which this transition is observed is the forming voltage. See FIG. 6 for exemplary forming curves, showing forming voltages near −4 V.

After the forming process, in the subsequent switching, only a portion of the original oxygen content of the filament can be recovered during reset process, as shown on FIG. 1E, where the filament is only partly occupied by oxygen (gray circles). This is why the set voltage is smaller than the forming voltage and the resistance in subsequent cycles is much smaller than the resistance in the initial fresh samples, even when the device is in its high resistance state (i.e., the high resistance state of FIG. 1E has a lower resistance than the original state of FIG. 1A).

BRIEF DESCRIPTION OF THE DRAWINGS

FIGS. 2A-G show structure of graphene based and Pt based RRAM in a vertical 3-D cross-point architecture.

DETAILED DESCRIPTION

I) Introduction

The rapid adoption of non-volatile memory technology such as Flash has enabled a revolution in today's mobile computing. To date, the ever-increasing demand for higher density has so far been met through the development of multi-level storage cells and smart peripheral control circuitry that hides the inadequacies and imperfections of the memory cell. However, the diminishing amount of stored charges and the increase in bit error rates that accompany feature-size scaling impose significant challenges for the future. Further gains in memory performance and device density will require new breakthroughs in both atomic-scale technology and bit-cost-effective 3-D device architectures.

Resistive random access memories (RRAM) based on metal oxide have shown considerable promise as a possible successor to Flash because of better endurance, retention, speed, lower programming voltages, and a higher device density. These devices also use material sets and fabrication temperatures that are compatible with today's silicon technology, and offer the opportunity for future monolithic three-dimensional integration with logic computation units.

Graphene, an atomically thin crystal lattice of carbon atoms, is known for its unique electronic properties. Both graphene and graphene oxides have been used in various memory devices, including RRAM, ferroelectric memory, and Flash memories as electrodes and oxides.

In this work, the atomically thin (~3 Å thick) edge of monolayer graphene was actively used as a SET electrode to form an atomically thin memory structure. We investigate the low energy consumption and the stacking potential of the device in a 3-D architecture that is amenable to large scale manufacturing.

II) Results

IIa) Device Structure in a 3-D Vertical Cross-Point Architecture

Figure 1A:
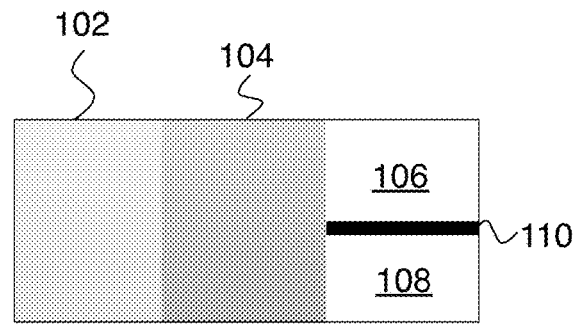
FIG. 1A shows a starting structure for embodiments of the invention.
Figure 1B:
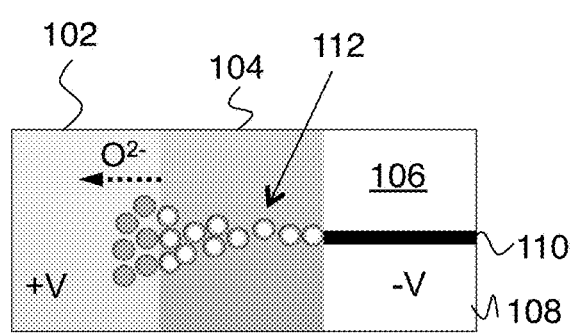
FIGS. 1B-C show operation of the structure of FIG. 1A after device forming according to prior work.
Figure 1D:
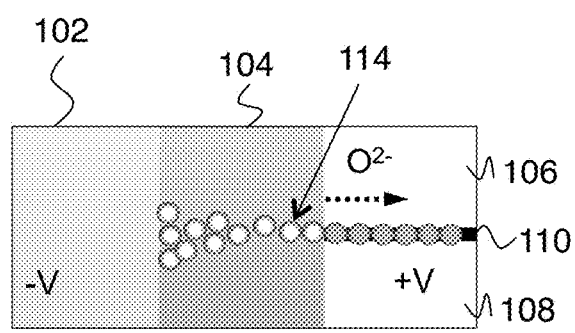
FIGS. 1D-E show operation of the structure of FIG. 1A after device forming according to embodiments of the invention.
Figure 1C:
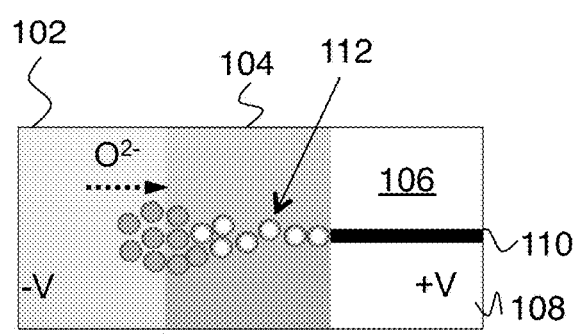
Figure 1E:
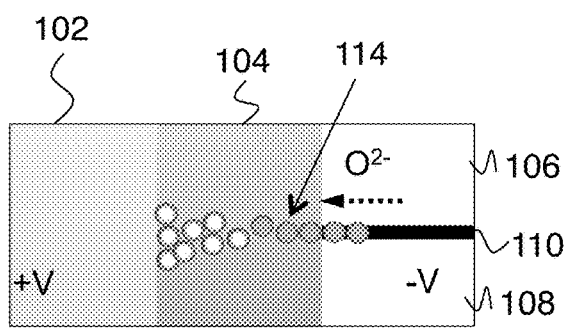
Figures 2A, 2B:
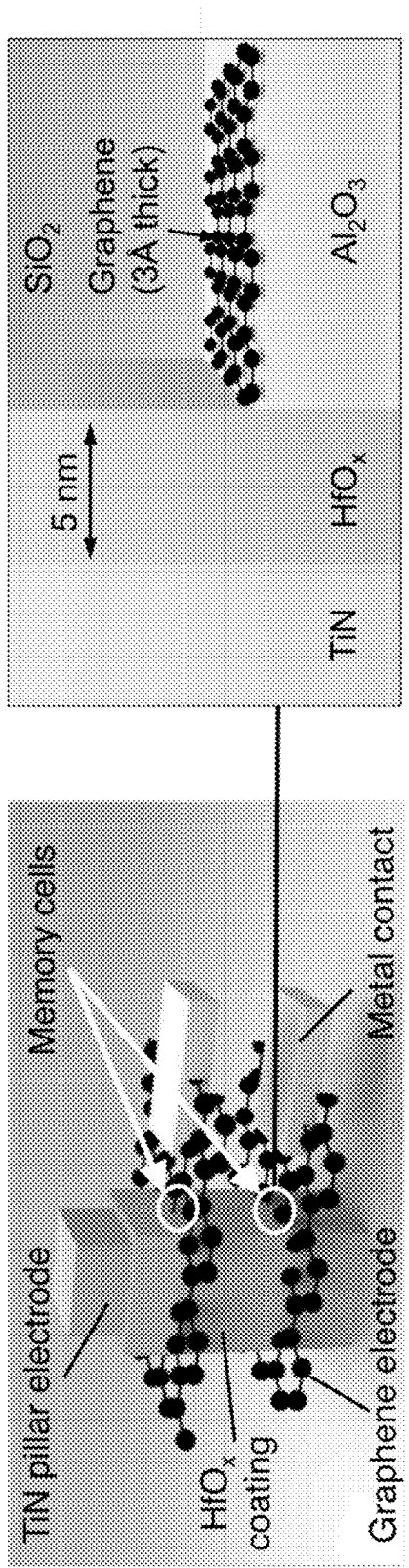
Figure 2F:
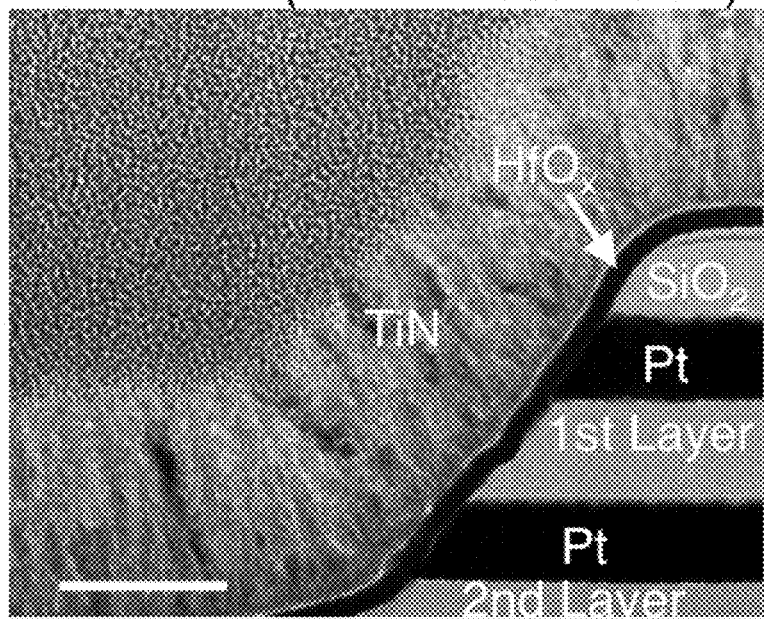
Figure 2G:
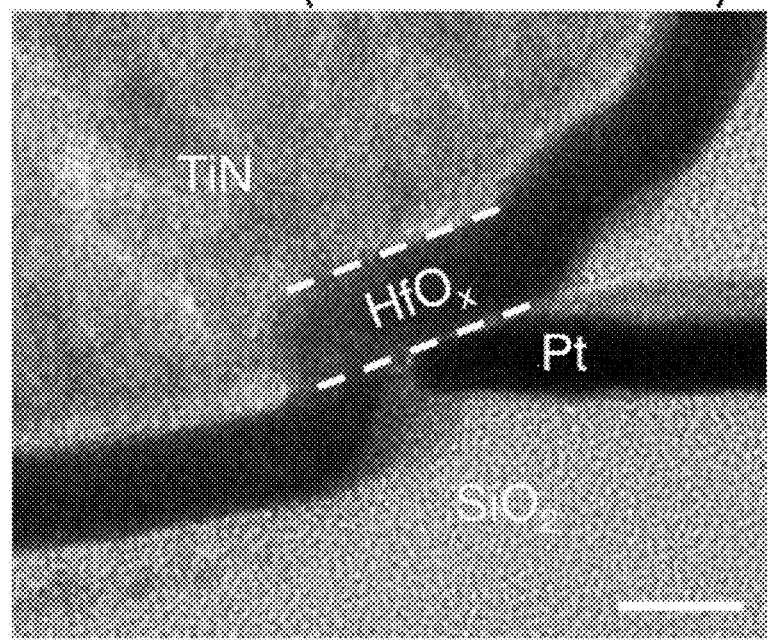

FIG. 2A is an illustration of graphene-based RRAM in a vertical cross-point architecture. The RRAM cells are formed at the intersections of the TiN pillar electrode and the graphene plane electrode. The resistive switching HfOx layer surrounds the TiN pillar electrode and is also in contact with the graphene plane electrode. FIG. 2B is a schematic cross-section of the graphene-based RRAM. FIG. 2C is an HR-TEM image (details in Methods) of the two-stack graphene RRAM structure. The RRAM memory elements are highlighted in black. The scale bar is 40 nm. FIGS. 2D and 2E are images of the first and second layer of GS-RRAM with graphene on top of the $Al_2O_3$ layer. The scale bars are 5 nm. FIGS. 2F and 2G are TEM images of the two-stack Pt based RRAM from previous work. The scale bar is 40 nm for FIG. 2F and 5 nm for FIG. 2G.

Two layers of graphene RRAMs (GS-RRAM, GS stands for graphene SET electrode) were stacked to build a 3-D vertical cross-point architecture as illustrated in FIGS. 2A and 2B. A transmission electron microscope (TEM) image of the device's cross-section is presented in FIGS. 2C-E. The graphene edge contacting the memory element ($HfO_x$) is highlighted in black. We also fabricated RRAMs based on platinum electrodes (Pt-RRAM) as control devices. The Pt-RRAM (FIGS. 2F, 2G) which was reported previously has the same 3-D structure as the GS-RRAM.

Such 3-D architectures are part of an ongoing drive in the research community to adopt a bit-cost-effective architecture with storage densities surpassing that of Flash technology. From past experimental results, the density of a 3-D vertical RRAM array is known to be mainly limited by the sheet resistance and the layer thickness of the plane electrode, and not so much by the lithographic half-pitch, as it is in 2-D architectures. This is due to the limitation of the pillar electrode resistance and the non-vertical etching angle resulting from trench etching through metal planes. Graphene's sheet resistance per thickness (125Ω per square at a monolayer thickness of 3 Å when doped) is significantly lower than that of any metal. All metal films are known to exhibit a steep exponential increase in sheet resistance as the thickness falls below 5 nm. Graphene is also significantly easier to etch vertically than metal during pillar formation. Using a well-accepted reliability projection—assuming programming voltage of 3V, $SiO_2$ thickness of 6 nm, half-pitch of 22 nm, and 1° of etch angle improvement—a maximum of 200 stacks will be possible for graphene RRAM as compared to the 60 stacks possible with conventional bulk-metal-based 3-D RRAM.

In both of our RRAM structures, the conductive filaments of oxygen vacancies form at the oxide ($HfO_x$) similar to conventional metal oxide resistive memories. The number and the size of the conducting filament paths determine the two resistance states of the RRAM: the high resistance state (HRS) and the low resistance state (LRS). In the Pt-RRAM structure (FIG. 2G), TiN is used as the SET electrode as in most conventional devices with TiN-oxide-Pt structures. In the GS-RRAM structure (FIGS. 2A-E), however, the graphene electrode is used as the SET electrode to store (SET) and release (RESET) the oxygen ions during the programming process. This is fundamentally different from our previous work on graphene RRAM where the TiN electrode was the SET electrode. The application of graphene as the SET electrode led to power consumption 120 times lower in this work compared to the previous graphene RRAM work.

IIb) The Device Characteristics of GS-RRAM

Figure 3A:
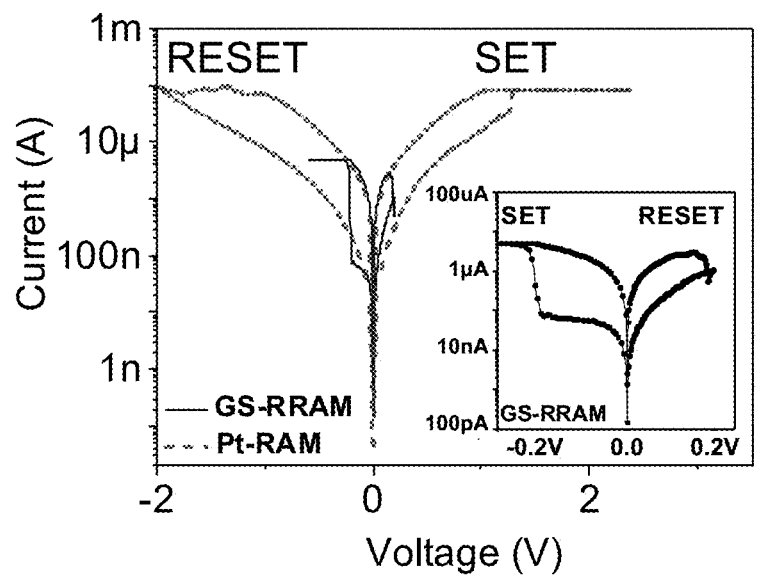
FIGS. 3A-G show the device characteristics of GS-RRAM compared to Pt-RRAM and other emerging memory devices.
Figure 3B:
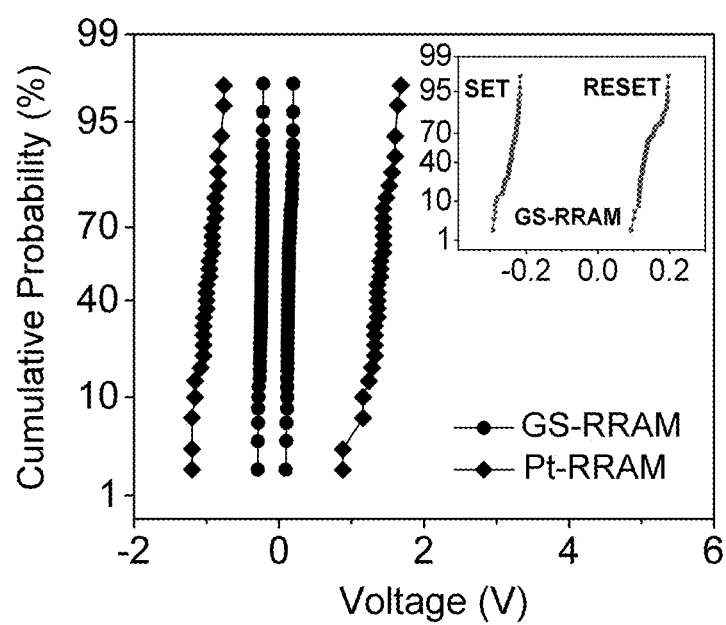
Figure 3C:
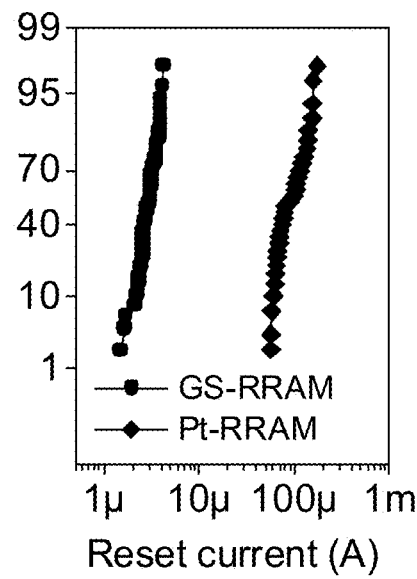
Figure 3D:
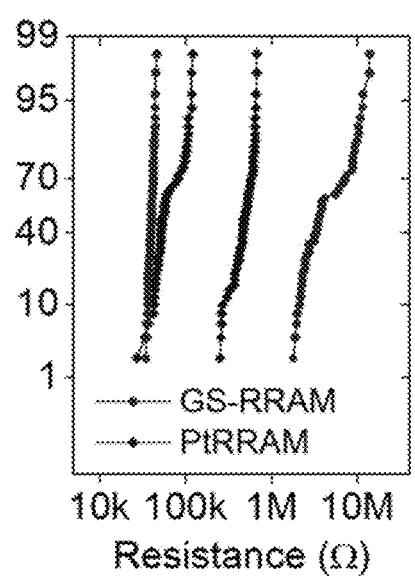
Figure 3E:
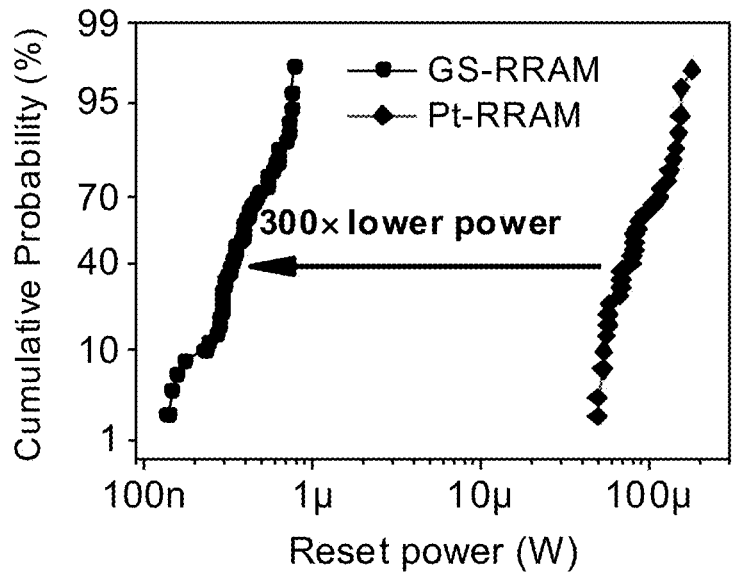

FIG. 3A is a typical measured DC I-V switching characteristic of GS-RRAM and Pt-RRAM. For Pt-RRAM, SET process is observed when positive voltage is applied to TiN. For GS-RRAM, SET process is observed when positive voltage is applied to graphene. The SET compliances for G-mode, T-mode, and Pt-RRAM are 5 µA, 10 µA, and 80 µA, respectively for optimum conditions. A magnified plot of GS-RRAM is shown as inset. FIG. 3B shows the SET and RESET voltage distribution of GS-RRAM and Pt-RRAM after 50 cycles of switching. The SET/RESET voltages of GS-RRAM are noticeably lower (inset). FIG. 3C shows reset current distribution of GS-RRAM and Pt-RRAM after 50 cycles. GS-RRAM exhibit much lower reset current compared to Pt-RRAM. FIG. 3D shows resistance distribution after 50 cycles for GS-RRAM and Pt-RRAM at 0.1V. Larger memory windows are observed for GS-RRAM compared to Pt-RRAM. FIG. 3E shows reset power distribution of GS-RRAM and Pt-RRAM. The power consumption of GS-RRAM is 300 times lower than that of Pt-RRAM. This is from the combined effect of lower programming voltages and currents.

Figure 3F:
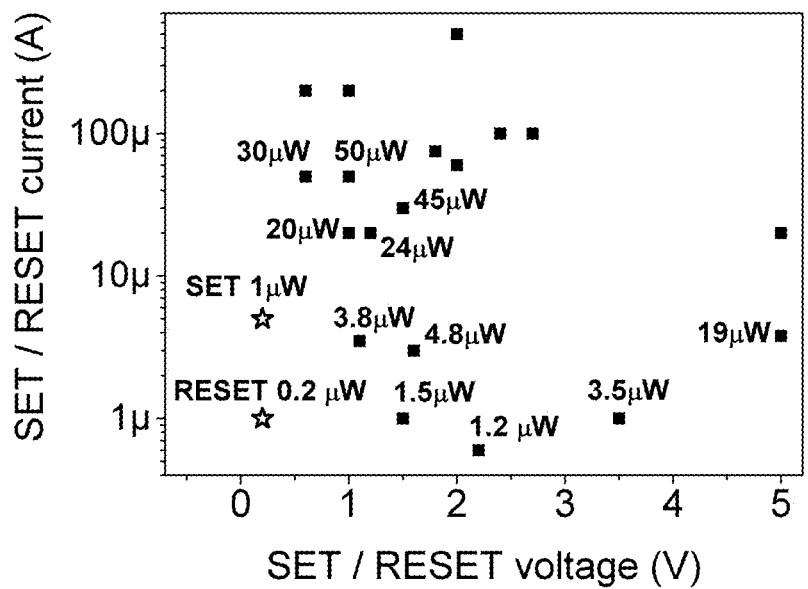

FIG. 3F is a comparison of power consumption of this work relative to other reported results. Programming voltages, currents, and power consumptions from the recent reports on low power RRAMs were plotted. With one of the lowest SET/RESET voltages ever recorded, the SET and the RESET power consumption of the demonstrated GS-RRAM (shown as stars on FIG. 3F) exhibit extremely low values. From a practical application point of view, the process that consumes the most power (SET or RESET) is plotted for other works, since the larger value determines the power delivery requirements for the chip.

Figure 3G:
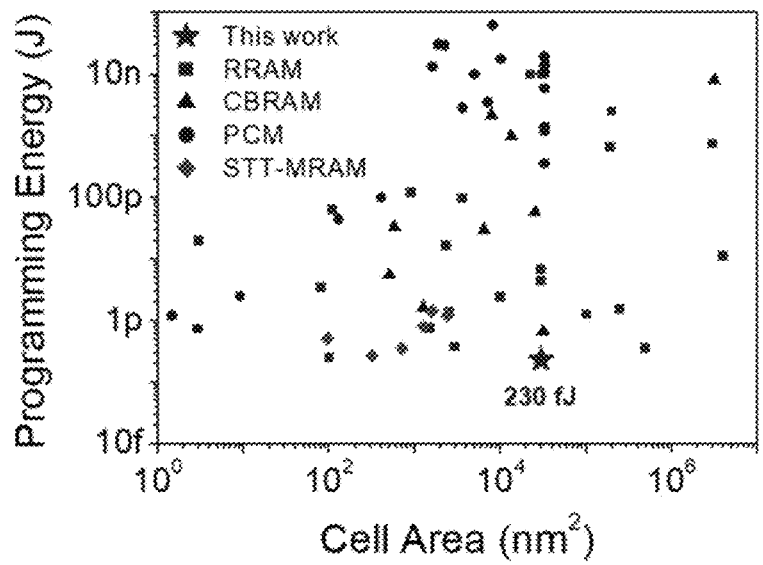

FIG. 3G is a comparison of programming energy for GS-RRAM and other emerging non-volatile memories with respect to cell area. The switching energy for GS-RRAM is one of the lowest.

A comparison of the typical SET/RESET switching cycle of the GS-RRAM and the Pt-RRAM is shown in FIG. 3A (inset: magnified view of GS-RRAM plot). The SET programming is achieved by applying a positive voltage to the TiN electrode in the Pt-RRAM and a negative voltage to the TiN electrode in the GS-RRAM. The SET/RESET voltage and the RESET current distribution of GS-RRAM and Pt-RRAM after 50 cycles of switching are shown in FIGS. 3B and 3C. Importantly, the SET/RESET voltages and the RESET currents of GS-RRAM are considerably lower than those of Pt-RRAM. The resistance distributions of both the HRS and the LRS states at 0.1 V bias after 50 cycles for both devices are shown in FIG. 3D. Even with such low programming voltages and current, the memory window is larger for GS-RRAM compared to Pt-RRAM (FIG. 3D).

The power consumption of an RRAM cell is given by the product of the programming voltages and the currents. Due to such low SET/RESET voltages and currents, the power consumption of the GS-RRAM is 300 times lower than that of the Pt-RRAM (FIG. 3E). In fact, the power consumption of the GS-RRAM is one of the lowest compared to recent reports on low power RRAMs (FIG. 3F). From the pulse-mode endurance test with 500 ns width pulse (see Methods), the switching energy (switching voltage×current×pulse width=0.2V×2.3 µA×500 ns) was found to be around 230 fJ. We compared this value with the values of other emerging non-volatile memories, including RRAM, conductive bridge RAM (CBRAM), phase change RAM (PCRAM), and spin-transfer torque magnetic RAM (STT-MRAM) in FIG. 3G, and found the energy consumption to be comparable to the lowest known values.

IIc) The Oxygen Ion Migration and Raman Imaging

Figure 4A:
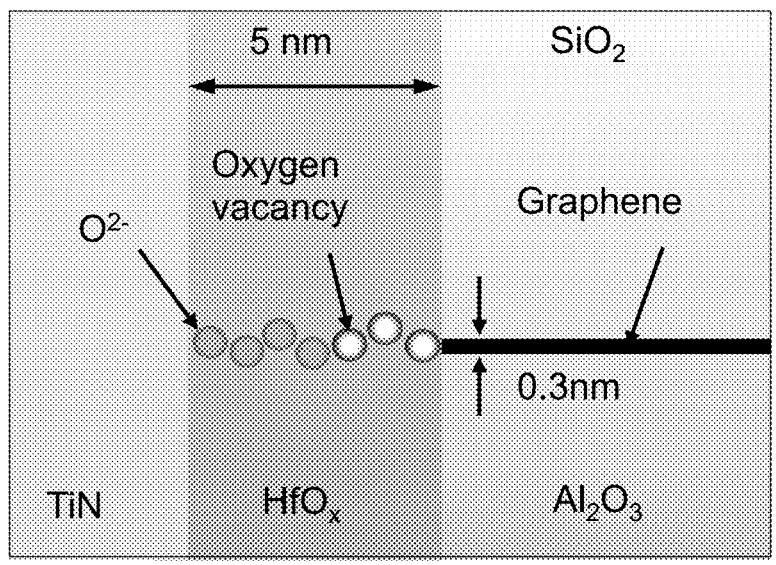
FIGS. 4A-H show the working mechanism and spatially resolved Raman imaging of oxygen ions in graphene during subsequent SET/RESET process of GS-RRAM.
Figure 4B:
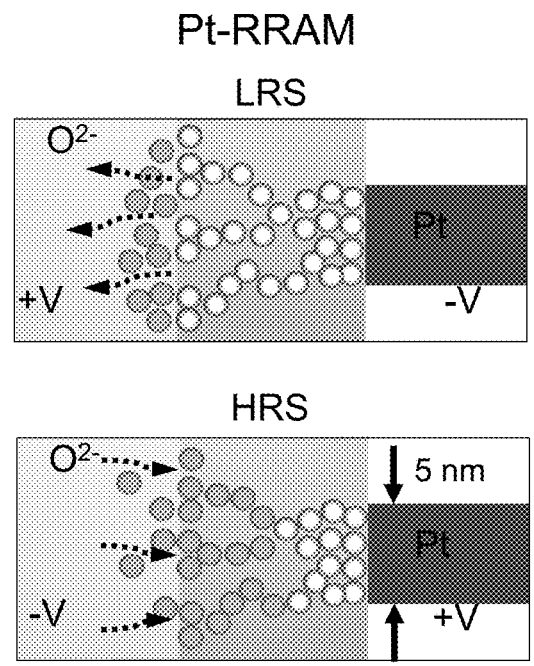
Figure 4C:
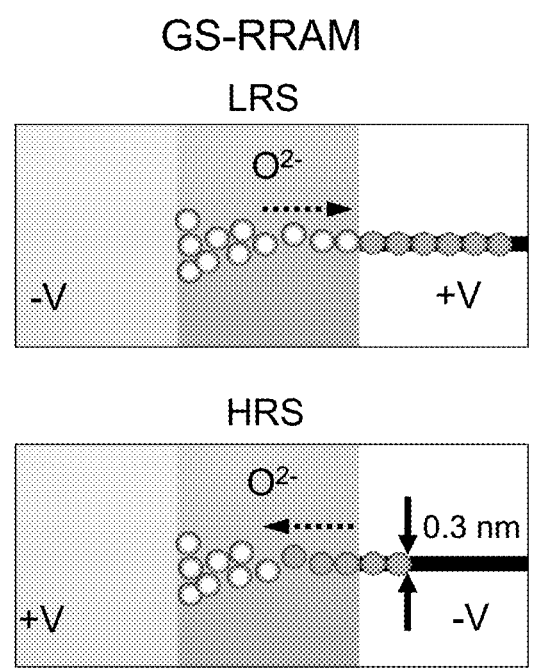
Figure 4D:
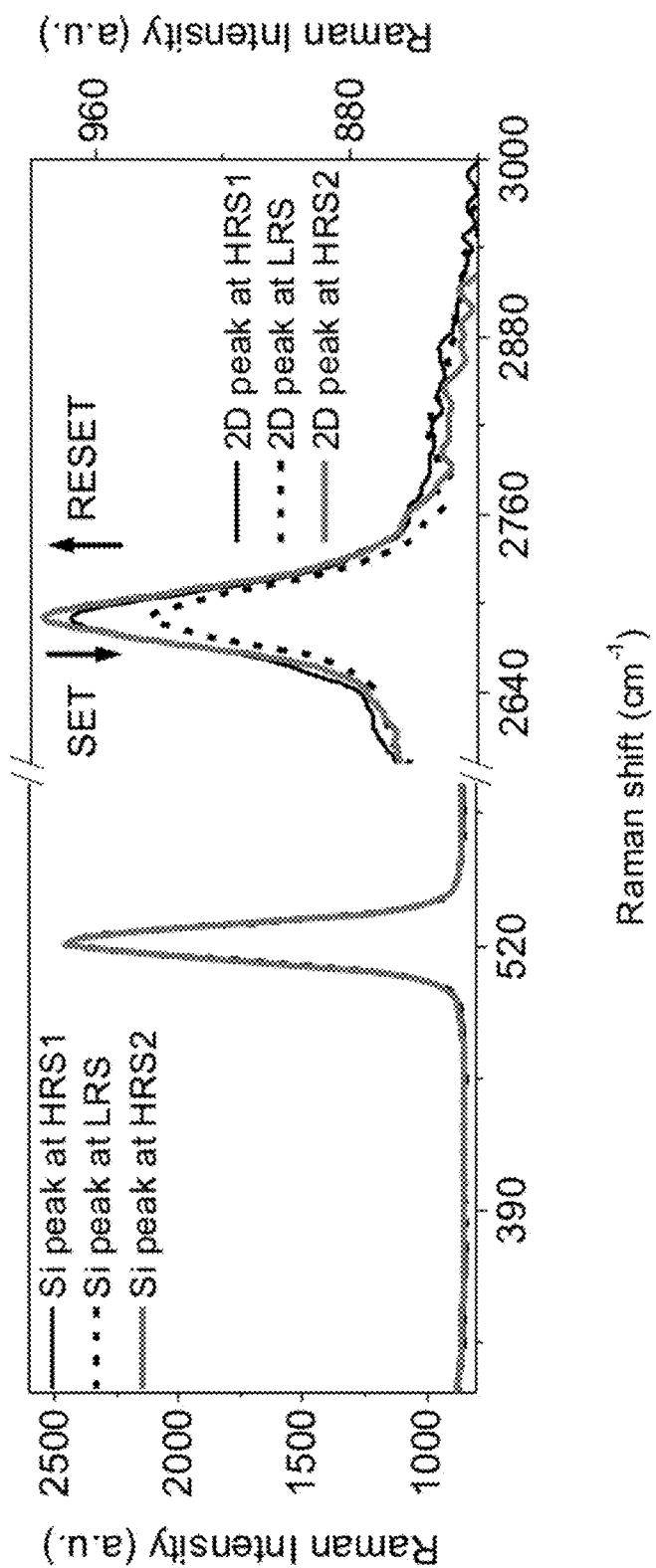
Figure 4E:
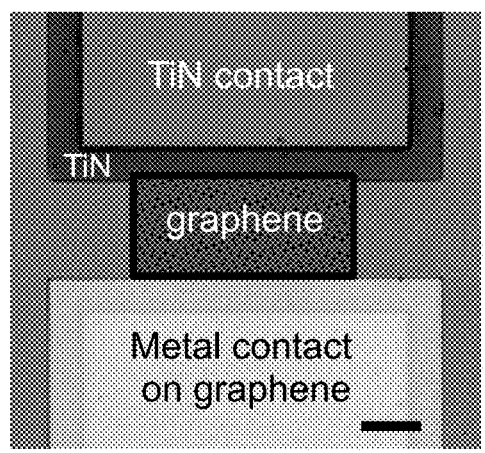
Figure 4F:
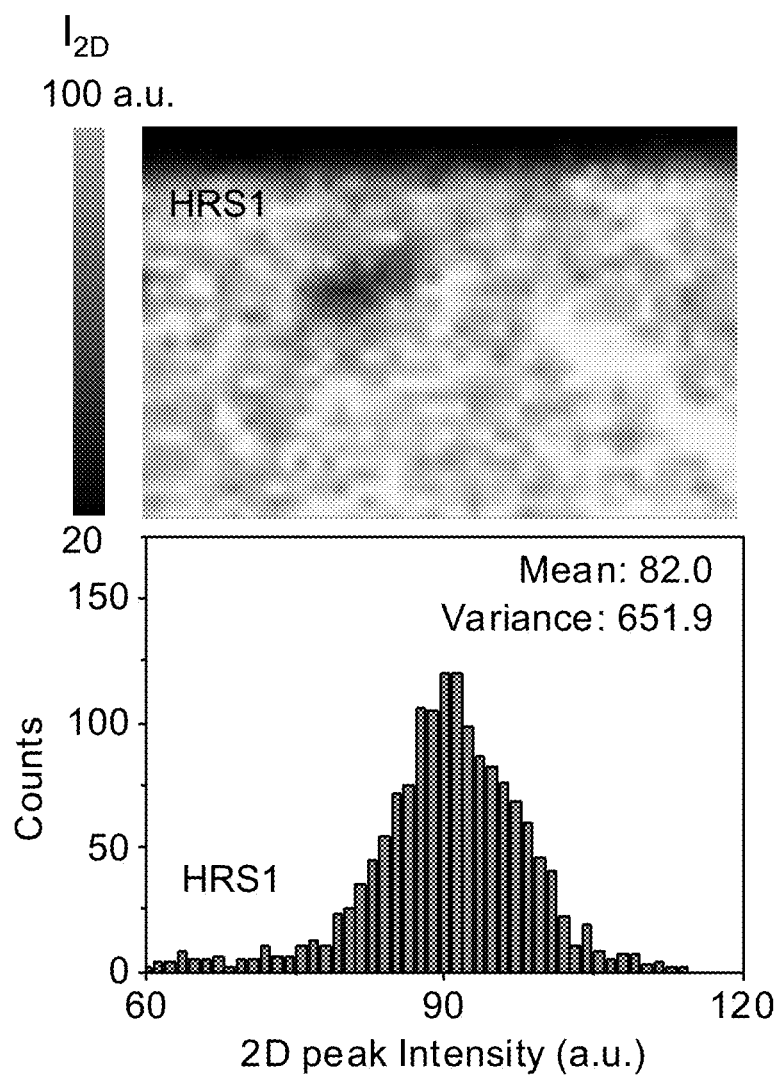
Figure 4G:
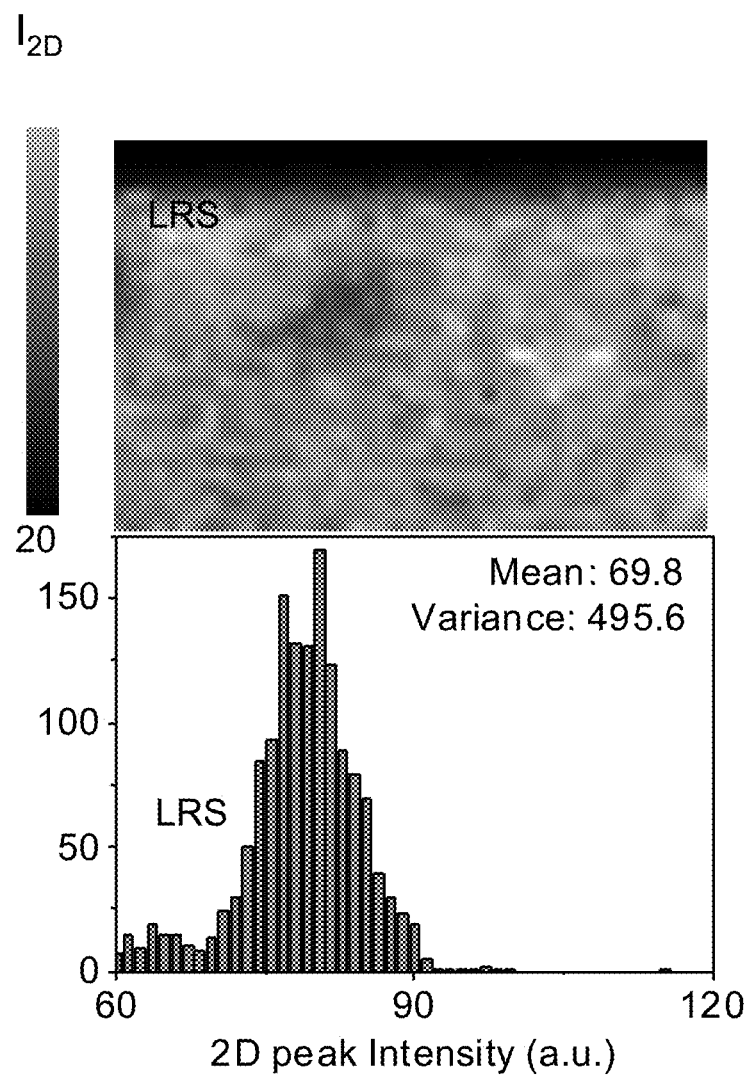
Figure 4H:
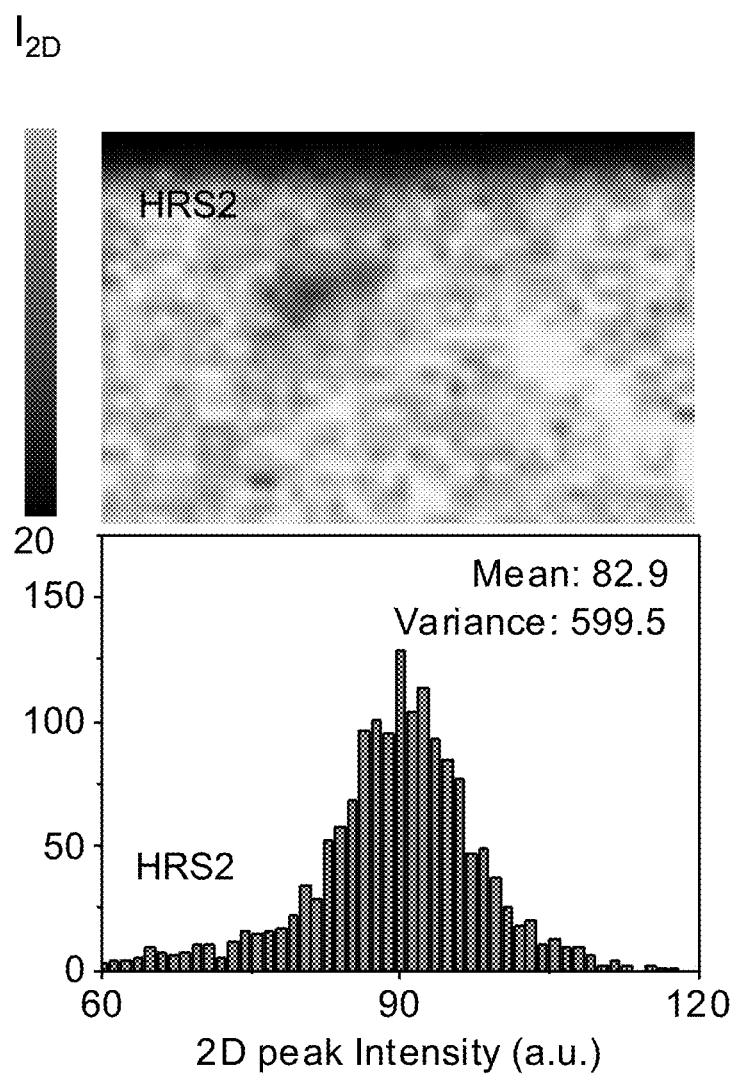

FIG. 4A is an illustration of the GS-RRAM structure. FIG. 4B shows the working mechanism of Pt-RRAM. SET process (oxygen vacancy filament formation) is achieved by applying positive voltage to the TiN electrode. FIG. 4C shows the working mechanism of GS-RRAM. The SET process is achieved by applying positive voltage to graphene instead of the TiN electrode. Notice the opposite direction of oxygen ion movement in GS-RRAM compared to Pt-RRAM. FIG. 4D show changes in the 2-D Raman peak intensity as the oxygen is inserted (SET) and extracted (RESET) from the graphene film. The laser intensity was kept constant during the measurements. Notice that the reference silicon peak (520 cm$^{-1}$) is not changing during this transition. FIG. 4E is a microscopic image of the Raman mapped area labeled as 'graphene'. The scale bar is 15 µm. FIGS. 4F-H are 2-dimensional Raman scanning of the 2-D peak intensity in the mapped area before programming (FIG. 4F), after oxygen ions are inserted into graphene via SET process (FIG. 4G), and after oxygen ions are pulled out from graphene via RESET process (FIG. 4Hh). All three images have the same color scale for 2-D peak intensity and the laser intensity was kept constant during the measurements (See Methods). The darker hue is observed for graphene with the oxygen ions in (FIG. 4G). The scale bar is 10 um. The statistical distributions of the 2-D peak intensity changes are also shown as histograms. Noticeable changes in the median values are observed as the oxygen ions are inserted into and pulled out from the graphene film.

The mechanism behind the low power/energy consumption can be explained by first understanding the oxygen ion migration during the switching process. FIGS. 4B and 4C illustrate the different ways the oxygen ions move and form conductive filaments during the programming process of the Pt-RRAM and the GS-RRAM. For Pt-RRAM, the TiN is the SET electrode and the conducting filaments in the oxide are formed via oxygen migration from $HfO_x$ to the TiN electrode (FIG. 4B).

In a GS-RRAM, however, a negative voltage is applied to the TiN electrode during the SET process, and the oxygen ions move toward the graphene (FIG. 4C). Unlike in conventional metal, there will be an electrical potential gradient in graphene since graphene is relatively more resistive (~6 kΩ per square) than a common metal. Hence, the oxygen ions will not accumulate at the edge but will migrate horizontally in the graphene and the oxide interface. In this work, the oxygen ion movement was confirmed by monitoring oxygen dopants in graphene using Raman spectroscopy (FIGS. 4D-H, also see Methods). One of the most pronounced indicators of dopants in graphene is the reduction of 2-D peak intensity in a Raman spectrum. In FIG. 4D, a typical change in the 2-D peak (2670 cm$^{-1}$) intensity is observed for HRS→LRS→HRS transition. During the SET process (i.e. HRS→LRS), oxygen ions are inserted into the graphene, doping the film. Consequently, a decrease in the 2-D peak intensity is observed. During the RESET process, (i.e. LRS→HRS) oxygen ions are pushed back into HfO$_x$ from the graphene film. This results in an increase in 2-D peak intensity. The Raman peak intensity of silicon (520 cm$^{-1}$) and the baseline are plotted in parallel to ensure that the references have not changed during measurement (see Methods).

The spatially resolved Raman spectroscopy results for the change in 2-D peak intensity during the HRS→LRS→HRS transition are shown in FIGS. 4F, 4G, and 4H, respectively. The rectangle labeled 'graphene' in FIG. 4E indicates the Raman-mapped region in the actual device. As the device is switched from HRS to LRS via the SET process, the change in the 2-D peak intensity can be readily observed by the contrast difference. The statistical distributions of the changes in 2-D peak intensity are also shown as histograms. Noticeable changes in the median values and the standard deviation of the 2-D peak intensity are observed as the oxygen ions are inserted into and pushed back from the graphene film. This oxygen migration in graphene is also known to be aided by the Joule heating generated during the SET/RESET event. Experimental studies also suggest that oxygen can be highly mobile in graphene and can be used as an oxygen capturing layer. As indicated in the literature, the oxygen may form a covalent bond with the broken bonds of graphene after the SET process, and the process is reversed during the RESET process.

IId) The Working Mechanism

Figure 5A:
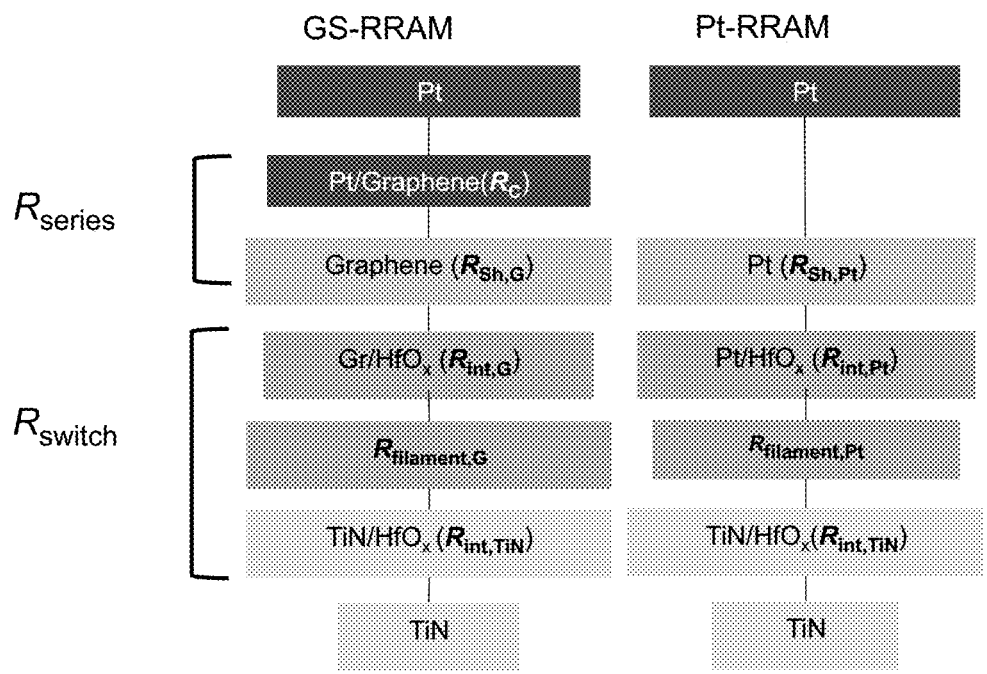
FIGS. 5A-F show resistance component breakdown, retention, pulse endurance, device variations, and array performance of stacked GS-RRAM.
Figure 5B:
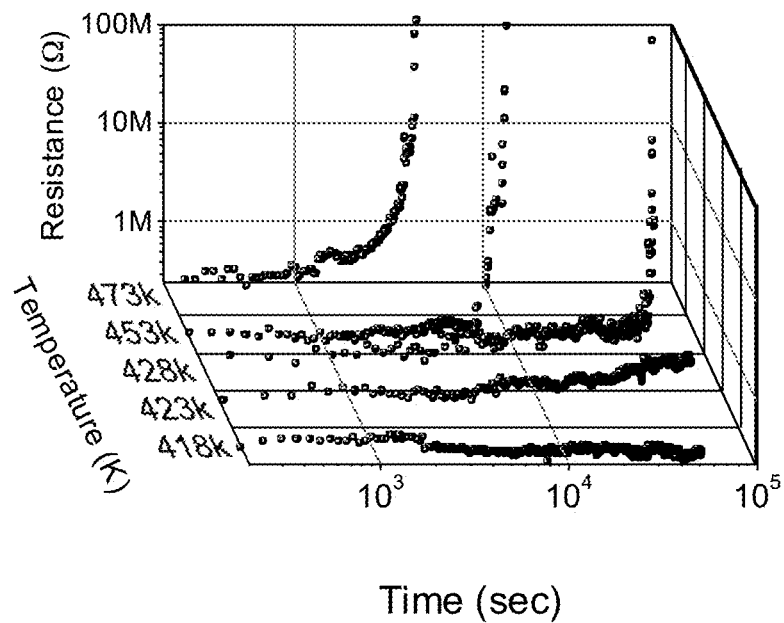
Figure 5C:
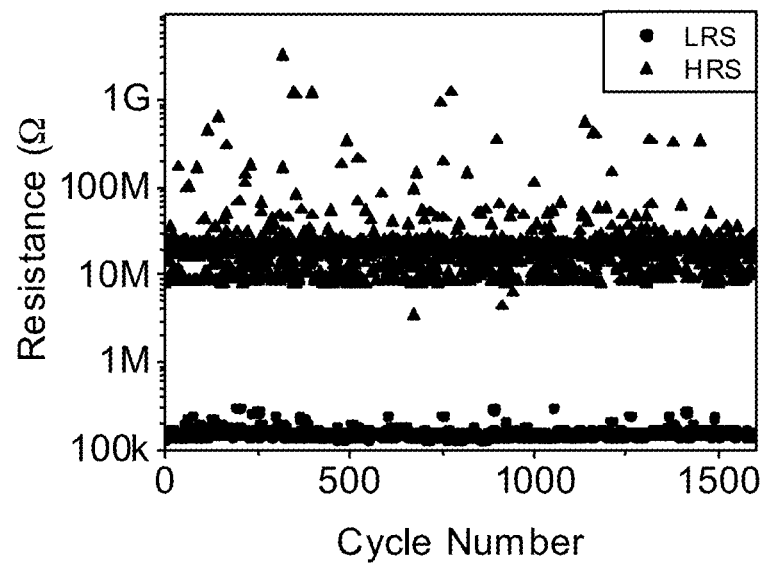
Figure 5D:
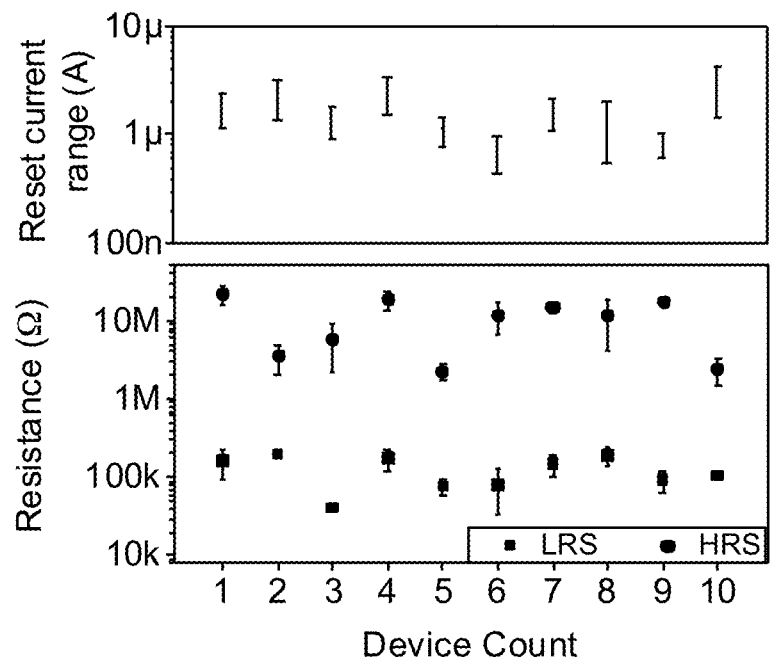
Figure 5E:
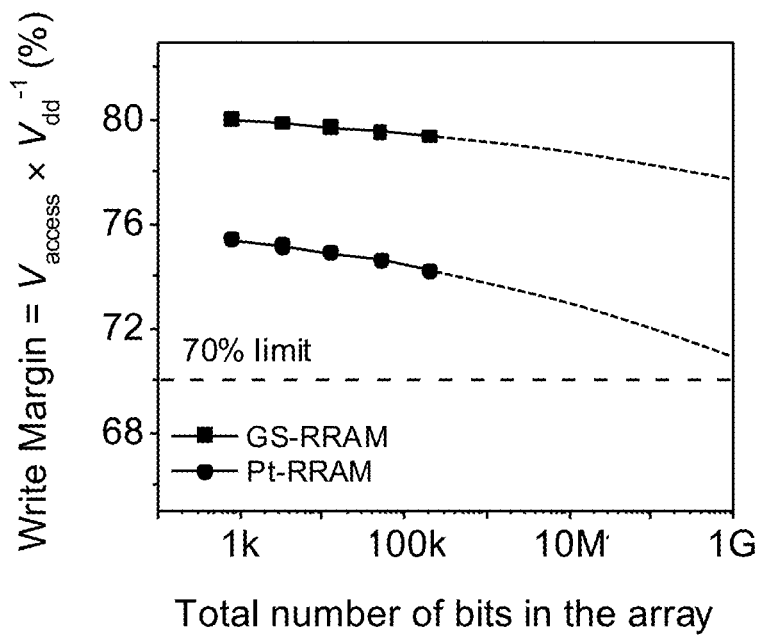
Figure 5F:
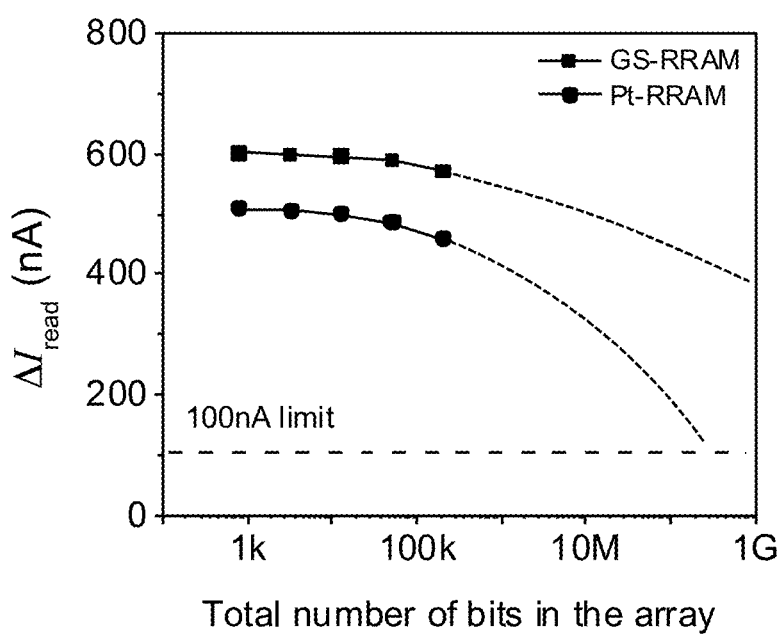

FIG. 5A shows resistance component breakdown of GS-RRAM and Pt-RRAM. In comparison to Pt-RRAM, GS-RRAM has 4 different resistance components: Pt/graphene contact resistance ($R_C$), graphene film resistance ($R_{sh,G}$), graphene/HfOx interface resistance ($R_{int,G}$), and the thickness of the conduction filaments ($R_{Filament,G}$) FIG. 5B shows temporal evolution of GS-RRAM LRS resistance at temperatures ranging from 418K to 473K near 0.1V bias. Elevated temperatures were used in this study to obtain the critical time (i.e. filament rupture time) for oxygen migration within a reasonable time frame (See Methods). FIG. 5C shows results of a pulse endurance test of GS-RRAM. Device switched with over 70× difference in HRS and LRS, and suffered no read/write disturbance after more than 1600 cycles. FIG. 5D shows the maximum to minimum reset current distribution (top) and HRS/LRS resistance distribution after 50 cycles (bottom) for 10 randomly chosen GS-RRAMs. The cycle-to-cycle variations are shown as error bars which represent one standard deviation for each case. All devices were measured under the SET compliance current of 5 μA. The worst case scenario still exhibits HRS to LRS ratio exceeding 10×. FIG. 5E shows a write margin comparison of Pt-RRAM and GS-RRAM for a 3-D architecture with 200 stacks. FIG. 5F shows a read margin comparison between Pt-RRAM and GS-RRAM for a 3-D architecture with 200 stacks.

The GS-RRAM offers significantly lower power consumption compared to Pt-RRAM due to three factors: low SET compliance current (FIG. 3A), low RESET current (FIG. 3C), and low programming voltages (FIG. 3B). The Pt-RRAM cannot be operated with such low currents or voltages, and shows severe degradation of the memory window when it is programmed with a lower compliance current.

The low SET compliance current in GS-RRAM is possible due to a more resistive HRS and a larger memory window (FIG. 3D) compared to Pt-RRAM. Since the magnitude of the RESET current is directly proportional to the SET compliance current, the low RESET current is also related to these two factors. A systematic breakdown of the resistance components can be used to understand the differences in LRS/HRS of the two devices (FIG. 5A). Three factors may contribute to the increased resistance of HRS in GS-RRAM compared to Pt-RRAM: the access series resistance $R_{series}$ from the graphene sheet compared to the Pt sheet, the difference of the TiN/oxide ($R_{int,TiN}$) and graphene/oxide($R_{int,G}$) interface, and the different sizes (FIGS. 4B and 4C) of filamentary conduction paths in HfO$_x$ ($R_{filament,Pt}$ and $R_{filament,G}$). From a transmission line measurement, we found that compared to Pt the additional sheet resistance and the contact resistance of graphene contributed little to the total resistance of HRS. On the other hand, the filamentary resistance and the interfacial resistance between materials (graphene, Pt, or TiN to HfO$_x$) dominated the total resistance change during the SET/RESET process.

It is known that in an RRAM structure, the resistance of HRS increases as the inverse of the cell area, roughly following Ohm's law. Specifically, the higher HRS of the GS-RRAM compared to Pt-RRAM is closely related to the tail-end thickness of the conducting filaments (CF) in the HRS conditions (FIGS. 4B, 4C bottom panels). Because of the thicker Pt electrode edge compared to the graphene edge, the tail end of the CF will be thicker in the Pt-RRAM compared to the ones in the GS-RRAM. This greater thickness results in the more conductive HRS of Pt-RRAM.

The LRS of these devices are related not only to the size of the filaments but also to the different effects of oxygen in the TiN and the graphene electrodes. The LRS of Pt-RRAM (FIG. 3D) is comparable to that of GS-RRAM, even with larger filaments (FIGS. 4B, 4C top panel). This is due to the effect of oxygen in TiN. It is fairly well known that oxygen forms a thin TiO$_x$N$_{1-x}$ film in the TiN layer, which works as a barrier against diffusion and carrier transport. Such a barrier increases the interfacial resistance for Pt-RRAM ($R_{int,\ TiN}$), and the total resistance at LRS becomes comparable to that of GS-RRAM.

Figure 6:
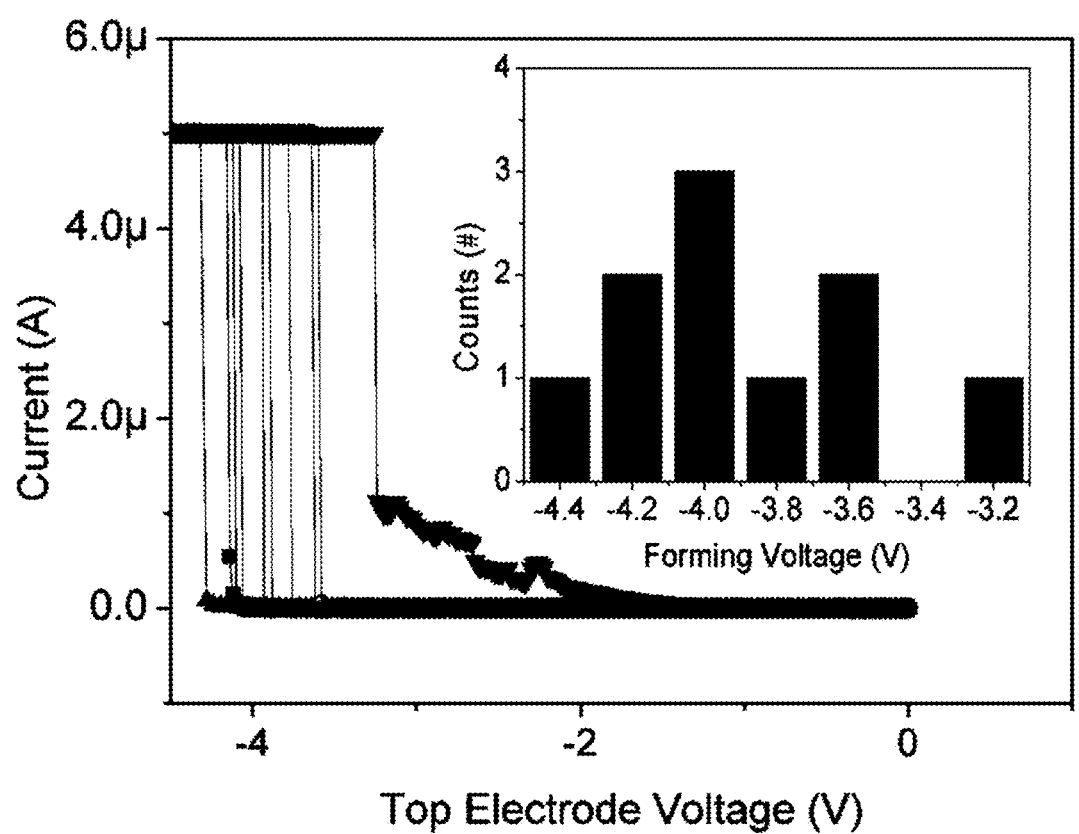
FIG. 6 shows forming curves for several experimental GS-RRAM devices.

FIG. 6 shows exemplary forming results for the GS-RRAM. The top electrode is the TiN electrode during the forming process. Forming curves are collected from 10 cells with 5 μA compliance current. Inset: forming voltage distribution.

The low SET/RESET voltage is related to the thickness of the electrode and the oxygen migration mechanism. After the forming process (FIG. 6), the tip of the conducting filament will be near the top electrode (FIG. 4C). The graphene serving as the SET electrode will have a much stronger electric field at the edge compared to the large TiN electrode because graphene is a monolayer thick. Therefore, a lower SET voltage will be sufficient to pull the oxygen ions from the oxide. On the other hand, we expect the lower RESET voltages are attributed to the lower activation energy for oxygen migration in graphene and the absence of a TiO$_x$N$_{1-x}$ diffusion barrier that is typically formed in TiN electrodes. The activation energy of diffusion for oxygen in graphene (0.15-0.8 eV, carrier density dependent) is known to be lower than that of TiN (0.95-2.1 eV). Since the RESET mechanism is closely related to the oxygen diffusion assisted by Joule heating and its activation energy, the required electrical potential for RESET will be lower for the graphene electrode than for the TiN electrode. The temperature-accelerated LRS retention-time measurement can probe the thermal activation of oxygen ion migration from the graphene to the oxide, as shown in FIG. 5B. From the linear fitting of the Arrhenius plot (Methods), we estimate the activation energy for oxygen ion migration in graphene to be 0.92 eV, which is lower than the known values for TiN. It is worth noting that the work functions of graphene (4.56 eV) and TiN (4.5 eV) are comparable, and the difference in SET voltages cannot be explained by work function difference alone.

The result of the pulse mode endurance test in FIG. 5C indicated that the GS-RRAM maintained large memory window (>70×) and showed no sign of deterioration after more than 1600 cycles of switching (Methods). The yield of the GS-RRAM (88%) was also comparable to that of the Pt-RRAM (92%). The reset current and the HRS/LRS characteristics of 10 randomly chosen GS-RRAM devices are shown in FIG. 5D.

IIe) 3-D Array Simulation

The storage density of a cross-point architecture is ultimately limited by the sneak-path leakage in the half-selected and unselected cells. During the write operation, the extra voltage drop along the interconnects caused by the leakage current can lead to an insufficient voltage at the selected cell. During the read operation, parasitic conducting paths in unselected cells can degrade the output signal. To systematically investigate how the sneak-path leakage would limit the bit storage capacity of the 3-D memory array, a Simulation Program with an Integrated Circuit Emphasis (HSPICE) circuit simulation for the 3-D array is performed, using the experimentally measured device properties (see Methods). Simulations are done using the worst-case data patterns with the 0.5×V write scheme and the column parallel read scheme. The write margin ($V_{access}$ to the $V_{dd}$ ratio) and the readout margin ($\Delta I_{read}$, the current difference between the on and the off state) as a function of total number of bits for the GS-RRAM and Pt-RRAM arrays are simulated under worst-case conditions assuming 200-layer stacks (FIGS. 5E, 5F). The criteria that limit the total number of array bits during write and read operation are set at 70% and 100 nA, respectively. In FIGS. 5E and 5F, we observe that the write/read margin for GS-RRAM is larger and its degradation less pronounced, compared to those of Pt-RRAM, as the arrays become larger. This is a direct consequence of smaller pillar resistance enabled by thinner stacks of the graphene plane electrode with lower sheet resistance. Consequently, a larger array of graphene-based RRAM can be assembled without the adverse sneak-path leakage effect.

III) Discussion

In this work, we demonstrated how the unique advantages of a 2-D material can be exploited to outperform conventional materials in today's electronic applications. The E-field from the atomically thin edge electrode and the efficient ion storing/transport mechanism of graphene led to significantly lower power consumption. Graphene was also found to be the key enabler for ultra-high-density, bit-cost-effective 3-D RRAM arrays. The increased density and the low power consumption of an RRAM structure will enable significant progress in emerging application areas such as energy-efficient abundant-data computing and neuromorphic computing. RRAMs employing various oxides have already been demonstrated for spike-timing-dependent plasticity. A highly integrated electronic synapse network employing low power graphene memory in a bit-cost-effective 3-D architecture will be a significant step toward a highly efficient, next-generation computing system.

IV) Methods

IVa) HR TEM Sample Preparation and Imaging

The TEM-ready samples were prepared using the in situ FIB lift-out technique on an FEI Dual Beam FIB/SEM. For the imaging, we used an FEI Tecnai TF-20 FEG/TEM operated at 200 kV in bright-field (BF) TEM mode or high-resolution (HR) TEM mode.

IVb) Spatially Resolved Raman Spectroscopy

The images were taken with constant laser intensity right after the SET and the RESET programming. External perturbation was minimized with an oxide capping layer. For the purpose of Raman measurement, single-stack GS-RRAM (without the second stack) was fabricated and measured to eliminate any effect from the second graphene layer. A WiTec 500 AFM/micro-Raman Scanning Microscope was used for the 2-D Raman raster scanning of graphene. A 532 nm wavelength was used for all measurements. A 30 μm×60 μm area was scanned with an integration time of at least 4 seconds with a 1 μm resolution. Each measurement was conducted in less than 3 hours.

IVc) Extraction of Activation Energy

The temperature-accelerated LRS retention-time measurement can probe the thermal activation of oxygen ion migration, as shown in FIG. 5B. This will cause the oxygen ions to migrate back to HfOx, increasing the resistance (i.e. RESET) of the RRAM. The kinetics of this process can be described by the Arrhenius law.

$$\tau_{reset} = \tau_0 \cdot e^{\frac{E_a}{k_B T}} \quad (1)$$

The $\tau_{reset}$ is the characteristic time for RESET transition, $\tau_0$ is a constant, $k_B$ is the Boltzmann constant, $E_a$ is the activation energy barrier, and T is the absolute temperature. The linear fitting result of retention time in logarithmic scale versus reciprocal temperature provides a good estimation of the activation energy.

The measurements were done on a semi-automated probe system (Cascade Microtech, Summit) with a temperature controller (Temptronic SA166550). All measurements were done inside the test chamber with the nitrogen gas flowing. The setup was on an anti-vibration table with pneumatic vibration mount. The automated resistance measurement was conducted every 15 seconds to 3 min with 0.1 V bias using a semiconductor parameter analyzer (Agilent 4156C).

IVd) Pulse Mode Endurance Test

The pulse mode endurance test was conducted with an Agilent Parameter Analyzer 4155C and an Agilent Pulse generator 81110A connected to a Keithley Switch Matrix 707B. Pulse width was 500 ns with 3 s time delay and ±0.2V was the read voltage.

IVe) HSPICE Simulations on the Achievable Array Size

We adopted a resistance network and array simulation methodology for the worst-case selected cell of 3-D RRAM as reported in the literature. The effect of the sneak-path leakage in the achievable array size can be quantified with the write margin ($V_{access} \times V_{dd}^{-1}$) and the readout margin ($\Delta I_{read}$). The definition of $V_{access}$ is the voltage across the accessed cell in the resistance network. $\Delta I_{read}$ is defined as the difference in the current flowing through the read resistor (100 kΩ) when the RRAM cell is either in the HRS or the LRS. The HRS and the LRS values of GS-RRAM and Pt-RRAM were extracted from the experimental results of this work. $V_{dd}$, $V_{read}$, and $V_{half-bias}$ were set at 5V, 3.5V, and 2V, respectively. The maximum total bits for an array were determined using these criteria. The sheet resistance of Pt and doped graphene was assumed to be 300Ω per square and 125Ω per square, respectively. A selector parameter from a published result was adopted for the simulation. The resistance of the selector was 57.9 MΩ at the half-bias condition and 1 kΩ when it was turned on. During read programming, the selector was turned on and the resistance of the LRS of RRAMs was at least 5 times larger than the resistance of the selector during read operation. Feature size was 45 nm with a 12 nm selection material layer inserted in the pillar. The diameter of the Cu metal core was 5 nm and the thickness of TiN was 3 nm. The thickness of HfOx was 5 nm. Hence, the feature size was 2×(5+3+12)+5=45 nm.

The invention claimed is:

1. A method of making a non-volatile memory device, the method comprising:
   providing a structure including an oxide material disposed between a first electrode and a second electrode;
   wherein the first electrode includes a 2-D electrode layer sandwiched between a first insulator and a second insulator, and wherein the first electrode contacts the oxide material such that an edge of the 2-D electrode layer contacts the oxide material;
   forming the non-volatile memory device by applying a positive electrical bias to the first electrode relative to the second electrode sufficient to ensure that subsequent device operation changes a state of the non-volatile memory device by transfer of oxygen from the oxide material to the 2-D electrode layer of the first electrode, or vice versa;
   wherein the first insulator is distinct from the oxide material;
   wherein the second insulator is distinct from the oxide material.

2. The method of claim 1, wherein the 2-D electrode layer comprises a material selected from the group consisting of: graphene, 2-D metals, 2-D semi-metals, and 2-D transition metal dichalcogenides.

3. The method of claim 1, wherein the 2-D electrode layer comprises a material that is not reactive with oxygen.

4. The method of claim 1, wherein the 2-D electrode layer comprises a material having a sheet resistance of less than 100 kΩ/square when configured in a layer having thickness of 10 nm or less.

5. The method of claim 1, wherein the oxide material includes hafnium oxide.

6. The method of claim 1, wherein the first insulator and the second insulator have different compositions.

7. The method of claim 1, wherein the first insulator and the second insulator have the same composition.

8. The method of claim 1, wherein a high resistance state of the non-volatile memory device is provided by transferring oxygen from the 2-D electrode layer to the oxide material, and wherein a low resistance state of the non-volatile memory device is provided by transferring oxygen from the oxide material to the 2-D electrode layer.

* * * * *